(12) United States Patent
Ungar

(10) Patent No.: US 7,269,195 B2
(45) Date of Patent: Sep. 11, 2007

(54) LASER DIODE WITH AN AMPLIFICATION SECTION THAT HAS A VARYING INDEX OF REFRACTION

(75) Inventor: Jeffrey E. Ungar, Valley Village, CA (US)

(73) Assignee: Quintessence Photonics Corporation, Sylmar, CA (US)

( * ) Notice: Subject to any disclaimer, the term of this patent is extended or adjusted under 35 U.S.C. 154(b) by 0 days.

(21) Appl. No.: 10/379,027

(22) Filed: Mar. 3, 2003

(65) Prior Publication Data

US 2003/0231681 A1 Dec. 18, 2003

Related U.S. Application Data

(60) Provisional application No. 60/361,750, filed on Mar. 4, 2002.

(51) Int. Cl.
*H01S 5/00* (2006.01)

(52) U.S. Cl. .................. 372/43.01; 372/44.01
(58) Field of Classification Search ........... 372/29.016, 372/20, 21, 45, 43, 43.01, 44.01; 385/37
See application file for complete search history.

(56) References Cited

U.S. PATENT DOCUMENTS

| 4,249,142 A | | 2/1981 | Burnham et al. | |
|---|---|---|---|---|
| 4,433,417 A | | 2/1984 | Burnham et al. | |
| 4,694,459 A | * | 9/1987 | Burnham et al. | ........ 372/45.01 |
| 4,791,648 A | * | 12/1988 | Vojak et al. | ............. 372/46.01 |
| 4,965,806 A | * | 10/1990 | Ashby et al. | ............ 372/45.01 |
| 5,337,328 A | | 8/1994 | Lang et al. | |
| 5,644,584 A | * | 7/1997 | Nam et al. | ..................... 372/20 |
| 6,122,299 A | * | 9/2000 | DeMars et al. | ............... 372/20 |

(Continued)

FOREIGN PATENT DOCUMENTS

DE 197 17 545 A1 9/1998

(Continued)

OTHER PUBLICATIONS

McInerney J. et al., "High brightness semiconductor lasers with reduced filamentation", LEOS 99. IEEE Laser & Electro-Optics Society Nov. 1999, vol. 1, 8, pp. 78-79.

(Continued)

*Primary Examiner*—Dung (Michael) T. Nguyen
(74) *Attorney, Agent, or Firm*—Ben J. Yorks; Irell & Manella LLP

(57) ABSTRACT

A high powered laser diode that includes a pumped stripe section with a varying index of refraction. The varying index of refraction can reduce the self-focusing phenomenon found in high powered laser diodes in the prior art, thereby providing a high quality output beam. The index of refraction can vary from one side of the pumped stripe section to the other side of the pumped stripe section. The index can be varied by varying a structural characteristic of the pumped stripe section such as the doping or thickness of the layers within the laser diode. A thermal gradient can be created across the pumped stripe section to vary the index of refraction. The thermal gradient can be created by integrating a heating element along one side of the pumped stripe section or creating unequal current flow through the pumped stripe section.

8 Claims, 2 Drawing Sheets

U.S. PATENT DOCUMENTS 6,389,199 B1 * 5/2002 Eldada et al. ................. 385/37
6,421,363 B1   7/2002 Osinski et al.
6,556,611 B1   4/2003 DiMarco et al.

FOREIGN PATENT DOCUMENTS

JP         63 096988 A    4/1988
WO         WO99/66614 A   12/1999

OTHER PUBLICATIONS

Lindsey C et al: "Tailored-Gain Broad-Area Semiconductor Laser...", Electronics Letters, IEE Stevenage, GB, vol. 21, No. 16, Aug. 1, 1985, pp. 671-673.

* cited by examiner

LASER DIODE WITH AN AMPLIFICATION SECTION THAT HAS A VARYING INDEX OF REFRACTION

REFERENCE TO CROSS RELATED APPLICATION

This application claims priority under 35 U.S.C §119(e) to provisional Application No. 60/361,750 filed on Mar. 4, 2002.

BACKGROUND OF THE INVENTION

1. Field of the Invention

The subject matter disclosed generally relates to the field of semiconductor lasers.

2. Background Information

Semiconductor lasers are used in a variety of system applications. For example, laser diodes are commonly used as a light source in fiber optic communication systems. It is sometimes desirable to use very high powered laser diodes. For example, Erbium-doped fiber optic amplifiers and Raman fiberoptic amplifiers require pumping by a high powered laser. The pumping laser must emit a beam of high optical quality in order to be efficiently coupled to the fiber core. Because of efficiency, compactness and other factors it is desirable to pump the amplifier with a laser diode. Unfortunately, laser diodes with high quality beams typically have an upper power limit of approximately 0.5 watt, whereas fiber optic amplifiers may require 2 watts or more.

Referring to FIG. 1, the power of a laser diode 1 can be increased by widening the pumped stripe 2 of the diode 1. Widening the pumped stripe 2 reduces the optical power density and resultant heat within the diode 1.

It has been found that at high power densities, the light generated in a widened laser diode will "self-focus" into filaments across the length of stripe 2. This self-focus effect creates an output beam with intensity spikes as shown in FIG. 1. The quality of such an output is unacceptable for most photonic applications. It would be desirable to provide a high powered laser diode that emits a high quality laser beam.

BRIEF SUMMARY OF THE INVENTION

A laser diode that has a pumped stripe section with a varying index of refraction.

DETAILED DESCRIPTION

Disclosed is a high powered laser diode that includes a pumped stripe section with index of refraction that varies monotonically in the direction perpendicular to the direction of emission. The varying index of refraction can reduce the self-focusing phenomenon found in high powered laser diodes in the prior art, thereby providing a high quality output beam. The index of refraction can vary from one side of the amplifier section to the other side of the amplifier section. The index can be varied by varying a structural characteristic of the amplifier section such as the composition, doping, or thickness of the layers within the laser diode. A thermal gradient can be created across the amplifier section to vary the index of refraction. The thermal gradient can be created by integrating a heating element along one side of the amplifier section or by creating unequal current flow through the amplifier section.

Figure 1:
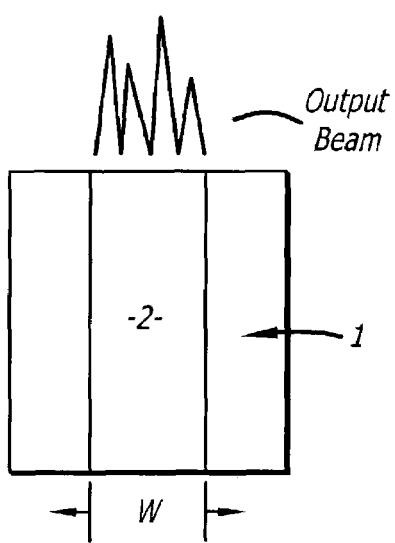
FIG. 1 is an illustration of a laser diode of the prior art.
Figure 2:
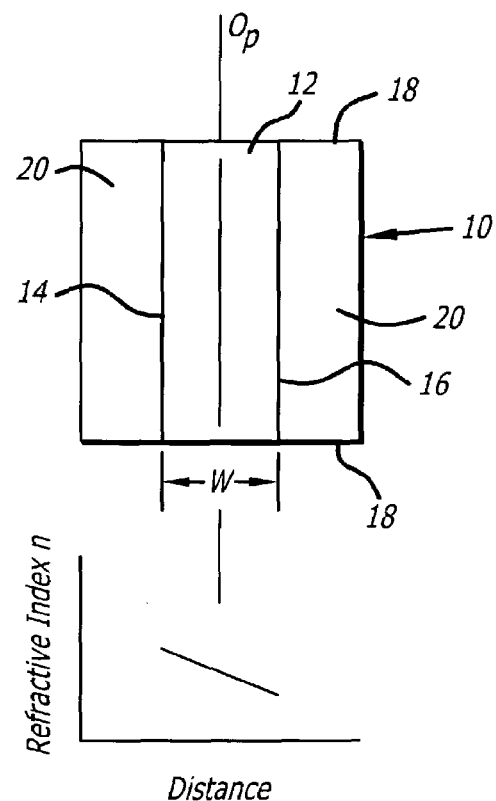
FIG. 2 is an illustration showing a laser diode.

Referring to the drawings more particularly by reference numbers, FIG. 2 shows a laser diode 10. The laser diode 10 includes a pumped stripe section 12. The pumped stripe section 12 has a first side 14 and a second side 16 that are separated by a width W. The pumped stripe section 12 is constructed to generate stimulated light emission that is emitted from the diode 10 along an optical axis $O_p$. The laser diode 10 may be constructed with a relatively wide pumped stripe section 12 that can emit a high quality light beam with up to 5 watts of power.

The laser diode 10 may have reflective surfaces 18 that create feedback for the stimulated light. Alternatively, the laser diode 10 may contain a separate distributed feedback section (not shown) that is coupled to the pumped stripe section 12. Stimulated light emission may be generated in the feedback section and further amplified in the pumped stripe section 12. The laser diode 10 may further have non-pumped sections 20 outside of the pumped stripe section 12.

As illustrated in FIG. 2, the index of refraction n may vary across the stripe 12 from the first side 14 to the second side 16. The index of refraction can be varied by varying a structural characteristic of the pumped stripe section 12. For example, the pumped stripe section 12 may be doped in a manner that creates a varying index of refraction. The thickness of one or more layers within the pumped stripe section may be varied to vary the index of refraction.

The varying index reduces the self-focusing effects that may occur in a high powered laser. The result is a high powered high quality laser beam. Although a linear gradient of the index is shown, it is to be understood that the index of refraction may have non-linear variation across the pumped stripe section 12.

Figure 3:
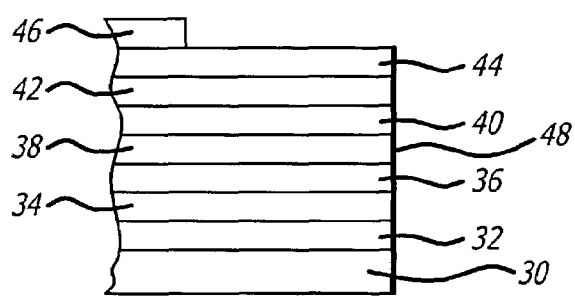
FIG. 3 is an illustration showing an embodiment of different layers of the laser diode.

FIG. 3 shows the different layers 30, 32, 34, 36, 38, 40, 42, 44 and 46 of an embodiment of the semiconductor laser 10. It is to be understood that the embodiment shown and described is merely exemplary and that other layers, materials and compositions may be used. The laser 10 may include a lower cladding 32 formed on a substrate 30. The substrate 30 may be an n-doped Indium Phosphide (InP) or Gallium Arsenide (GaAs) material. The cladding 32 may be an n-doped InP or GaAs material.

The laser 10 may further have a multi-quantum well active layer 36 located between confinement layers 34 and 38. Confinement layer 34 may be a n-doped InGaAsP or $Al_yGa_{1-y}As$ material. Confinement layer 38 may be a p-doped InGaAsP or $Al_yGa_{1-y}As$ material. Layers 40, 42 and 44 may be upper cladding that includes p-doped material. For example, layer 40 may be p-doped InGaAsP or $Al_xGa_{1-x}As$. Layer 42 may be p-doped InGaAsP or $Al_zGa_{1-z}As$ material. Layer 44 may be p-doped InP or $Al_xGa_{1-x}As$ material. Layer 46 may be an electrical contact layer containing $p^+$-doped InGaAs or GaAs material.

The layers 34, 36 and 38 create a PN junction that will generate stimulated light emission in response to a flow of electrical current. Cladding layers 32, 40, 42 and 44 form a waveguide that guides the light. Current flows through the pumped stripe section 12 from contact layer 46. The current causes stimulated emission of light within the pumped stripe section 12.

The semiconductor laser 10 can be constructed by initially forming layers 32, 34, 36 and 38 on the substrate 30. The remaining layers 40, 42, 44 and 46 can then be sequentially formed onto layer 38. All the layers can be formed with known epitaxial semiconductor fabrication processes. Although a laser diode 10 with layers 30, 32, 34, 36, 38, 40, 42, 44 and 46 are shown and described, it is to be understood that this embodiment is exemplary only and that the diode 10 may have a different construction.

Figure 4:
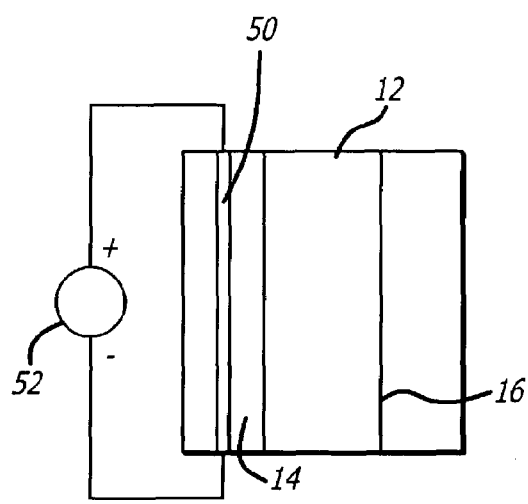
FIG. 4 is an illustration of an alternate embodiment of the laser diode.

FIG. 4 shows a different embodiment of a laser diode with a heating element 50 located adjacent to the first side 14 of the pumped stripe section 12. The heating element 50 may be an electrically resistive strip connected to a source of power 52. The heating element 50 may generate heat that flows into the pumped stripe section 12. Offsetting the heating element 50 adjacent to one side of the diode will create a thermal gradient across the pumped stripe section 12. The thermal gradient will vary the index of refraction from the first side 14 to the second side 16.

Figure 5:
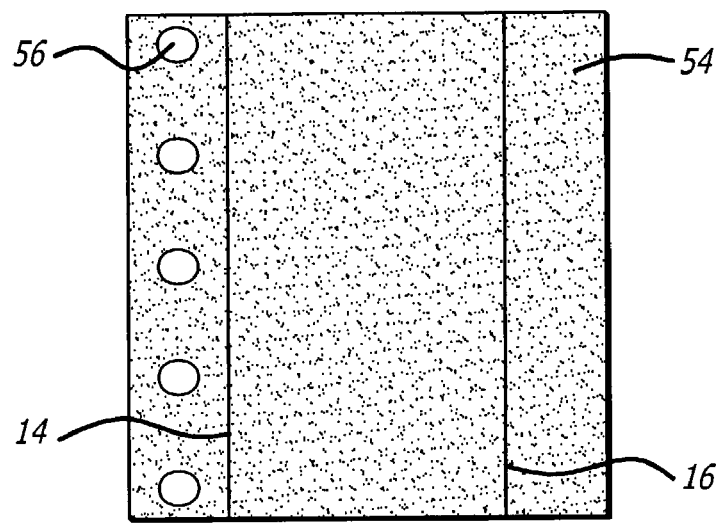
FIG. 5 is an illustration of an alternate embodiment of the laser diode.

FIG. 5 shows an alternate embodiment wherein the contact layer (not shown) is separated from the remaining layers by a layer of dielectric 54. The layer of dielectric 54 has a plurality of offset openings 56. Current only flows through the dielectric openings 56. The openings 56 may be located adjacent to the first side 14 of the pumped stripe section 12. The flow of current from the first side 14 will create a resultant thermal gradient across the pumped stripe section 12. The thermal gradient will vary the index of refraction from the first side 14 to the second side 16 of the pumped stripe section 12.

Figure 6:
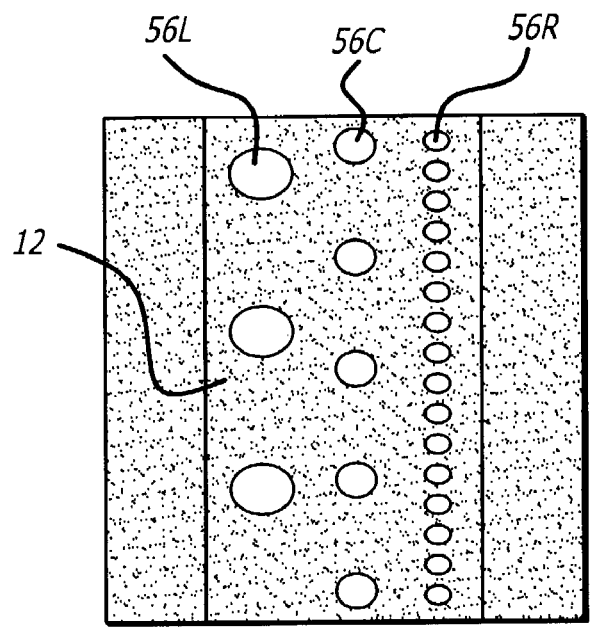
FIG. 6 is an illustration of an alternate embodiment of the laser diode.

FIG. 6 shows another embodiment wherein the openings 54R located adjacent to the second side 16 have a larger effective area than the openings 54L located adjacent to the first side 14 and openings 54C in the center of the pumped stripe section 12. The openings 54C in the center may have an effective area greater than the effective area of the opening 54L. The difference in effective areas will create an uneven flow of current through the pumped stripe section 12. This uneven current flow will cause a thermal gradient and varying index of refraction from the second side 16 to the first side 14 of the pumped stripe section 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A laser diode, comprising:
a single pumped optical gain stripe section that has a first side and a second side and an optical axis, and has a varying index of refraction gradient so that an index of refraction at said first side is different that an index of refraction at said second side and varies in a direction essentially perpendicular to said optical axis; and,
an optical feedback coupled to said single pumped optical gain stripe section.

2. The laser diode of claim 1, wherein said single pumped optical gain stripe section has a structural characteristic that varies in a direction essentially perpendicular to an optical axis.

3. The laser diode of claim 1, further comprising a heating element coupled to said single pumped optical gain stripe section, said heating element creates a thermal gradient across said single pumped stripe section that varies said index of refraction.

4. The laser diode of claim 3, wherein said heating element is located in an anti-pumped stripe section.

5. A method for operating a laser diode, comprising:
generating light that travels along an optical axis within a single pumped optical gain stripe section that has a first side and a second side; and,
varying an index of refraction of the single pumped optical gain stripe section to create a varying index of refraction so that an index of refraction at said first side is different than an index of refraction at said second side and varies in a direction essentially perpendicular to said optical axis.

6. The method of claim 5, wherein the index of refraction is varied by a heating element.

7. The laser diode of claim 1, wherein said index of refraction varies continuously across said single pumped optical gain stripe section.

8. The laser diode of claim 5, wherein said index of refraction varies continuously across the single pumped optical gain stripe section.

\* \* \* \* \*